United States Patent [19]
Loftness

[11] Patent Number: 5,381,098
[45] Date of Patent: Jan. 10, 1995

[54] TRANSMISSION LINE SPARKING LOCATOR

[76] Inventor: Marvin O. Loftness, 115 W. 20th Ave., Olympia, Wash. 98501

[21] Appl. No.: 144

[22] Filed: Jan. 4, 1993

[51] Int. Cl.⁶ .......................................... G01R 31/12
[52] U.S. Cl. .................................. 324/536; 324/520; 324/544
[58] Field of Search ............... 324/520, 536, 544, 551, 324/555

[56] References Cited

U.S. PATENT DOCUMENTS

| | | | |
|---|---|---|---|
| 3,551,804 | 12/1970 | Weddle | 324/520 |
| 3,820,018 | 6/1974 | Beasley et al. | 324/555 |
| 4,439,723 | 3/1984 | Loftness | 324/555 |
| 4,857,857 | 8/1989 | Valenti et al. | 324/555 |
| 4,998,070 | 3/1991 | Rosenberg et al. | 324/544 X |

Primary Examiner—Kenneth A. Wieder
Assistant Examiner—Glenn W. Brown
Attorney, Agent, or Firm—Olson & Olson

[57] ABSTRACT

This invention is an apparatus for detecting and pinpointing the sources of sparking electromagnetic RF radiation emanating from high and extra high voltage power lines in the presence of high level corona (RF) radiations which are often present on such lines. It uses a unique metal and plastic rod antenna which will not emit corona when brought up close to a high voltage conductor, and which acts as an attenuator and sensitivity indicator when pushed in steps into a special metal attenuator collar and into its metallic housing. Within the housing, the antenna rod is connected to receiving circuitry which provides sound output of the source noise-signal detected. The housing with its adapter may be removably attached to the tool holder of a standard power line hot stick to permit safe use of the apparatus as a proximity detector in pinpointing sources on power lines. The apparatus receives at a nominal UHF frequency of 430 MHz to permit detection of sparking without detecting corona.

7 Claims, 3 Drawing Sheets

TRANSMISSION LINE SPARKING LOCATOR

BACKGROUND OF THE INVENTION

In designing an apparatus for pinpointing sparking RF interference sources on high-voltage and extra-high-voltage power lines, the following considerations were made:

Point sources of high-level corona radiation are almost always present on EHV (extra-high-voltage) lines, those operating at 345 kV and above, and are frequently present on HV (high-voltage) lines, those operating at 115 kV and above).

Such corona is not usually the cause of radio and television interference complaints. Sparking is found to be the source of 95% of such complaints originating from power-line sources. For this reason it is important to know whether the RF noise sources are caused by corona or sparking. Then, if the sparking source(s) only are located and corrected, the complaints are usually resolved. (Sparking sources radiate broadband RF energy up to at least 600 MHz and sometimes to above 1000 MHz.)

Any metallic object, such as a locating antenna, brought up close to a high voltage conductor will tend to exhibit "self-corona," that is, corona will form on, and radiate corona plumes (visible in the dark) from such objects and also radiate electromagnetic waves, resulting from this corona. This RF noise, when resulting from corona, is not detectable by the locator of this invention above 20 MHz.

Even though the antenna and receiver are intended to receive noise-signals at the UHF frequency of 400 MHz, for example, if RF corona currents get inside the metal case housing the receiver, such corona RF currents may be picked up in the IF (intermediate frequency) stages of said receiver-said stages operating at a much lower frequency, such as at 10 MHz. This 10 MHz noise-signal picked up will then be detected along with said 400 MHz noise-signal.

A short metal rod antenna of perhaps a few inches in length was determined by the inventor to be most suitable for the proximity detection (or sniffer-type locating) intended. Here there is a self-corona problem, however, as noted in the above paragraph. Such a rod may be fixed or extensible, but should be designed so as not to go into corona when brought up close to an EHV conductor.

I decided in my invention to use an extensible rod antenna, because I could then also use it as a sensitivity control. Also, my goal was to make the apparatus as simple to operate as possible-with only one control. This is accomplished.

The self-corona problem on the slidable extensible rod antenna is overcome by using a part metal, part plastic rod. Said rod is plastic in the top portion and metal in the lower (as shown in FIG. 2). A knob of tubular plastic on the top of said rod and fastened with plastic screws is used to move the metal-plastic rod in and out. Using the proper plastic (nylon in the prototype) provides a sturdy and practical assembly, with said metal portion being the active antenna and said plastic portion being the manual-operating and self-corona-limiting portion. Here the top portion also prevents accidental metal-to-metal contact with the conductor with resultant arcing.

The metal-plastic rod is also found to be of advantage in the use of the rod as a sensitivity control.

It was found in the prototype that by using the rod antenna as a sensitivity control the sensitivity could be reduced to almost zero as desired, but that (not as desired) adjustment of sensitivity as the rod was pushed in was difficult because large changes in sensitivity resulted from very small changes in rod extension, particularly as the said apparatus was brought up close to a source. When close to a noise-signal source, the search is made with low sensitivity settings.

This sensitivity control problem was corrected by constructing (after some experimentation) an attenuation collar which permits suitably small changes in sensitivity to be made with reasonable changes in rod extension. Said attenuation collar is shown in FIG. 2. Here the air space inside the attenuation-collar may be considered as having less "RF field density" than that outside, and moving the junction of the metal-to-plastic of the rod down and through this airspace and partially into the housing provides suitably small steps of attenuation. Use of this attenuation-collar also permits full attenuation down to zero sensitivity. These attenuation steps are indexed on the rod, with the cursor being considered the top surface of the attenuation collar.

Because of the intended use of the device at EHV voltages, which requires longer hot sticks than used with my prior art apparatus disclosed in U.S. Pat. No. 4,439,723, my present invention is designed for use with standard solid core hot sticks rather than hollow core hot sticks as used with my prior art apparatus. Said standard solid core hot sticks are less flexible and more manageable in long lengths than the special shorter hollow hot stick. Said hollow hot sticks with sound conducted through the hot stick tubing and being emitted at the operator end are very practical at distribution voltages, but not at EHV voltages.

The longer hot stick lengths used require more audio output from the housing speaker than required in said prior art device in order that the noise signal may be satisfactorily heard at the hot stick operator's position, at the other (lower) end of the hot stick. This requires more battery power, and this is supplied by adequate batteries which may be recharged from a vehicle charging source.

Although no method for use of my prior apparatus, U.S. Pat. No. 4,439,723, is claimed in the patent, the design concept for locating is described in paragraph 3 of its Summary of the Invention: "Another object of this invention is the provision of an electrical systems defect detector and locator of the class described which functions rapidly first to locate the general area of a defect source by VHF sniffing and then immediately thereafter to pinpoint the defect source by ultrasonic sniffing."

In my present invention no ultrasonic function is used, and both the area-locating and the pinpointing phase of the operation are done with UHF sniffing; I also refer to "sniffing" as proximity detection.

These two functions are possible because of the excellent attenuation features of said antenna rod and attenuation collar assembly and because of the characteristic radiation of noise signals at 430 MHz and other UHF frequencies. Because of the much shorter wavelength at 430 MHz rather than at the 110 MHz of my prior art device, the area of significant radiation is confined to a much smaller area on the power line or structure.

The references cited as a possible challenge to my application of May 11, 1981 for my prior patent have been reviewed and these appear to have even less merit as a challenge to my present application, with the possible exception of Beasley, U.S. Pat. No. 3,820,018. Beasley shows a locator which can operate at a frequency of 450 MHz; however, it is not suitable for hot stick use. The instruments required, described but not illustrated, would weigh at least five pounds and would also be too bulky for hot stick use.

Beasley uses various antennas for four separate frequency channels. The smallest of these in his FIG. 4 could be used if it had a detector and amplifier attached for operation at 450 MHz; this would not be practical for hot stick use.

Using a yagi antenna at UHF frequencies from a bucket truck, as suggested by Beasley, has been tried by the myself and others, but it is not a suitable method of pinpointing a source on a structure; it is awkward and unreliable for identifying a point source, and in most real situations working with line crews it would not be done.

SUMMARY OF THE INVENTION

1. The main purpose of this invention is to pinpoint electromagnetic RF sources at sites of sparking (transient arcing) on high (HV) and extra high voltage (EHV) transmission lines and structures up to 550 kV.

2. An equally important purpose of the invention is to locate said sparking sources in the presence of high level corona sources which are often present on HV and EHV lines, and to distinguish said sparking sources, which are the main cause of RI and TVI, from corona sources, in order that said sparking from power lines may be pinpointed, without confusion from corona radiations, and then corrected.

3. An important purpose is to provide an instrument that can locate the general area of a sparking source on a structure as well as the specific site of sparking, without the use of an ultrasonic probe.

4. Another purpose is to provide an antenna rod assembly that can be used as an RF gain (or sensitivity control) by moving said antenna rod in and out of an RF-shielded metal housing, thus permitting the instrument to be used as a proximity detector; that is, permitting the operator to locate the point of maximum radiation of a sparking noise-signal using the lowest possible sensitivity, thus pinpointing the RF sparking noise.

5. Another purpose is to provide a special attenuation collar on the housing where the antenna rod enters said housing to provide the vernier adjustment required at low sensitivity levels as one gets closer to the source.

6. Another purpose is to provide an antenna rod where the outer portion, approximately one-third of the rod, is plastic, and the remainder active antenna portion is metal rod with this arrangement permitting the metal portion to be pushed completely inside its housing to reduce sensitivity to RF emissions from the power line to zero.

7. Another purpose is that the plastic portion of the antenna rod is enclosed on its outer end in a tubular plastic knob, which is secured with plastic screws to assure that no metal parts are in the plastic outer rod, which might result in corona being emitted from said metal parts when said rod is brought near a high-voltage conductor.

8. Another purpose is to prevent corona formation (self corona) on the portion of the housing which is brought up near the high voltage conductor and thus prevent resultant corona currents from flowing in the housing and being induced as RF noise into the instrument's intermediate (IF) and audio stages said stages which operate at lower frequencies and in the range of corona-noise emission frequencies. Self-corona is minimized on the housing by rounding all edges and covering the housing sides with paint or epoxy of suitable thickness.

9. Another purpose is to provide a moderately high level audio noise output as an indicator of sparking presence.

10. Another purpose is to provide a speaker output in the panel facing the operator, with the speaker grill consisting of many round holes of suitably small diameter, to provide RF shielding and yet provide audio transfer to the outside of said housing.

11. Another purpose is to provide an adapter bracket on the housing for attachment of the instrument to an industry standard type hot stick (non-conductive) pole in order that the operator may hold the instrument near the high-voltage conductor and at the same time separate himself from the high voltage by the length of the hot stick.

12. Another purpose is to provide moderately high level audio output, so that when the operator is holding the instrument with a long hot stick he may readily hear, via the instrument speaker, the presence of sparking noise.

13. Another purpose is to provide sensitivity setting markings (e.g. from 1 to 8) on the antenna rod this for reference as to settings used during a noise search, and as an instructional aid.

14. Another purpose is that when the antenna rod is pushed in completely (to zero sensitivity) it operates a microswitch in the housing to turn off the instrument and save battery.

15. Another purpose is to provide an instrument which is as simple to operate as possible, with only one control with said control being the antenna rod which controls the sensitivity of the apparatus and turns it on and off.

16. Another purpose is to provide an instrument that is compact, portable, and of suitable light weight for hot stick tool application.

17. Another purpose is to supply an instrument with rechargeable batteries of sufficient voltage (e.g. 12 V) and sufficient capacity to permit use of a voltage regulated converter and a moderately high power audio amplifier in the instrument circuit.

18. Another purpose is to supply an instrument using rechargeable batteries that may be recharged from a vehicular charging source.

DESCRIPTION OF THE PREFERRED EMBODIMENTS

Figure 1:
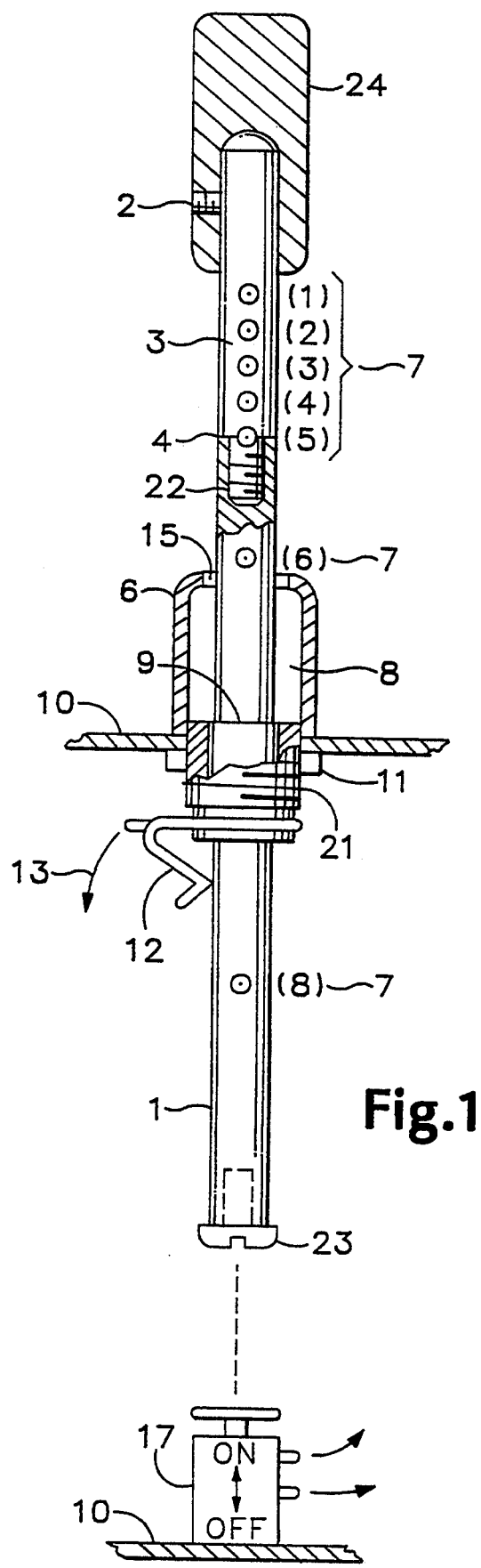
FIG. 1 is a vertical elevational view, partially in section, of the metal-plastic antenna rod being passed through its attenuation collar and being partially retracted into its housing.

The transmission line sparking locator illustrated in the drawings includes a metal, or metallized plastic, housing 10. On the top panel of said housing is mounted an extensible antenna rod formed of lower metallic portion 1 and upper plastic portion 3. The rod is mounted movably in insulated sleeve 9 within bushing 21. Said antenna rod may be moved upward in the sleeve so that the top end of the rod extends a few inches above the top panel of housing 10, and is stopped at insulated sleeve 9 when contacted by plastic stop screw 23 on the bottom of said rod. Moving in a downward direction, said rod is stopped by microswitch 17 and this stopping action actuates the microswitch 17, removing battery power and turning off the instrument.

Moving the antenna rod up increases the sensitivity of the locator, and moving the rod down decreases the sensitivity. The sensitivity of said locator is reduced to zero when the rod is pushed down so that the metal to plastic junction 4 is barely below the point where it enters insulated bushing 21. Note that the approximately top third of the antenna rod is plastic and the bottom portion is metal; the top portion is threaded with its threads 22 into mating threads of the metal portion 5 of the antenna rod. Said antenna rod passes through special attenuation collar 6 as it is moved up and down. This metal attenuation collar has a circular opening 15 at the top with a larger diameter than the diameter of said antenna rod. At its bottom, said internally threaded collar 6 is tightened securely onto bushing 21 and onto the top housing panel 10 and it is thus grounded to said housing. Index marks 7, numbered (1) to (8) are shown on the rod 1, 3 in FIG. 1 to assist in adjusting the extension or retraction of the rod relative to the top end of the collar 6.

When holding the apparatus with a hot stick near a sparking-source, the resulting RF field from this sparking-source has less density within the chamber e of collar 6 than it does in the outside air, because of the partial shielding of the RF by said collar 6. This permits easy adjustment of sensitivity. This is especially important at the low levels of sensitivity which must be used when the lineman or other operator is "closing in" on a sparking source in his noise search. It is found that without this collar, a very small change in antenna rod extension results in a large change in sensitivity, making sensitivity adjustment critical and not repeatable.

At this stage, at the start of "closing in" on a noise source, the rod is pushed in until index mark (5), is adjacent the top end collar 6 and definite, reasonable, and easy to make steps in attenuation will be apparent as the rod is pushed in to steps (4), (3), (2), and (1). The sparking source will then be located at the point where it can be detected at the lowest sensitivity setting. For example, at setting (2), the noise-source may be detected, but not at setting (1). At setting (2) then, if the operator finds in scanning the area that he can find the source at only one location, that location is the source, or very close to the source.

Sometimes sources are hidden from view, as for example, sparking between a metal insulator socket and an adjacent insulator ball pin in a suspension string; these are detected by the locator, nevertheless.

Note that contact spring 12 rides on the antenna rod as the rod is moved up and down. Connecting lead 13 is connected to said spring and transfers the noise-signal picked up by the antenna to the 430 MHz receiver in the housing.

The assembly consisting of 9, 11, 12, 12, and 21 is an insulated stereo phone jack #16PJ086 of Mouser Electronics, 12 Emery Ave., Randolph, N.J. 07869, which is a suitable mounting for the sliding antenna rod.

Part 24 is a plastic knob held with plastic screw 2. These plastic parts in the top portion 3 of the antenna rod help prevent the metal portion 1 of said rod from going into corona and also help prevent arcing should the antenna come in contact with high voltage.

Figure 2:
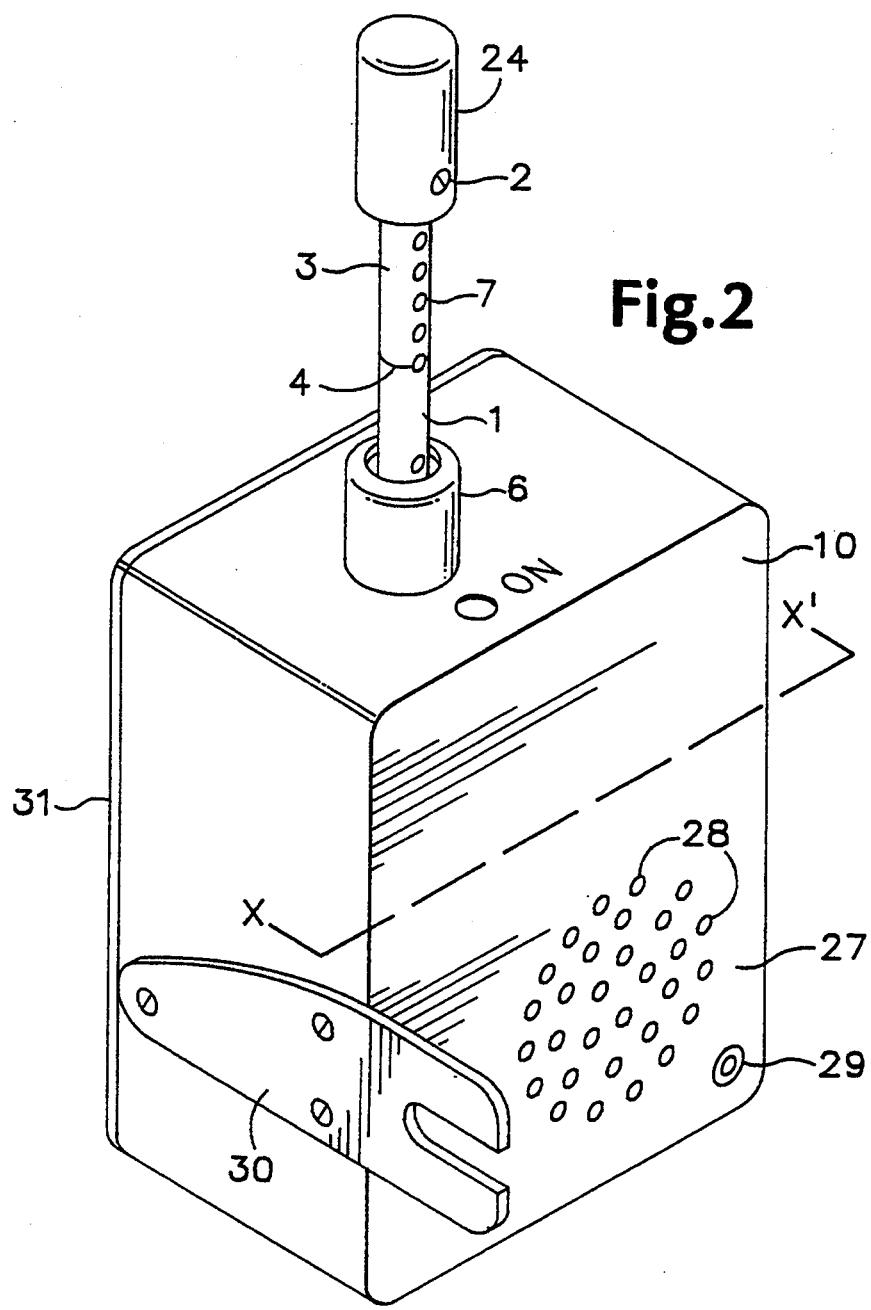
FIG. 2 is a perspective view in approximate half-size of the complete transmission line sparking locator.
Figure 3:
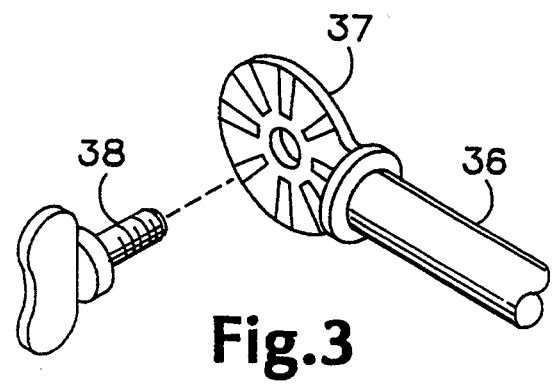
FIG. 3 is a fragmentary perspective view of a power line hot stick for holding the locator during its use.

Referring to FIG. 2, the metal housing 10 is shown; the metal cover 31 on the back has ridges on its inside perimeter which fit inside the housing edges permitting the housing 10 when thus covered to provide good shielding from noise signals. The speaker grill 28 has numerous small openings for sound transfer, but also provides the required shielding. The speaker panel is generally facing the operator when the locator is in use, and the usual fastening of the hot stick 36 with adapter 30, tool holder 37 and wing bolt 38 is normal to the speaker panel. 30 is the hotstick tool adapter permanently fastened to said housing 10. A battery charge jack 29 is a miniature phone jack.

Special care is taken in manufacture to insure that all metal parts above dotted line x'x' in FIG. 2 are rounded, and flush screws are used in order that such parts do not exhibit self-corona when that portion of the device (the most vulnerable portion) is brought close to high voltage conductors. Corona RF currents resulting could be induced into the IF stages of the receiver inside the housing and give false detection of noise signals. Such corona noise signals are considerably lower in frequency than the sparking-noise signals at 430 MHz. The locator detects sparking noise signals in the presence of corona noise signals, but this statement does not mean that corona need be present for such detection. There are locations on EHV lines that have very low level corona radiation under certain weather conditions, when no dust or insects are present, or as the result of very careful line design. EHV lines that have aged and weathered for a few years are often quieter than new lines. Under usual conditions, corona should be expected, and must be allowed for (as this Transmission Line Sparking Noise Locator does) when searching for sparking sources. All HV and EHV lines are noisier during rain or moist weather as a result of corona.

Figure 4:
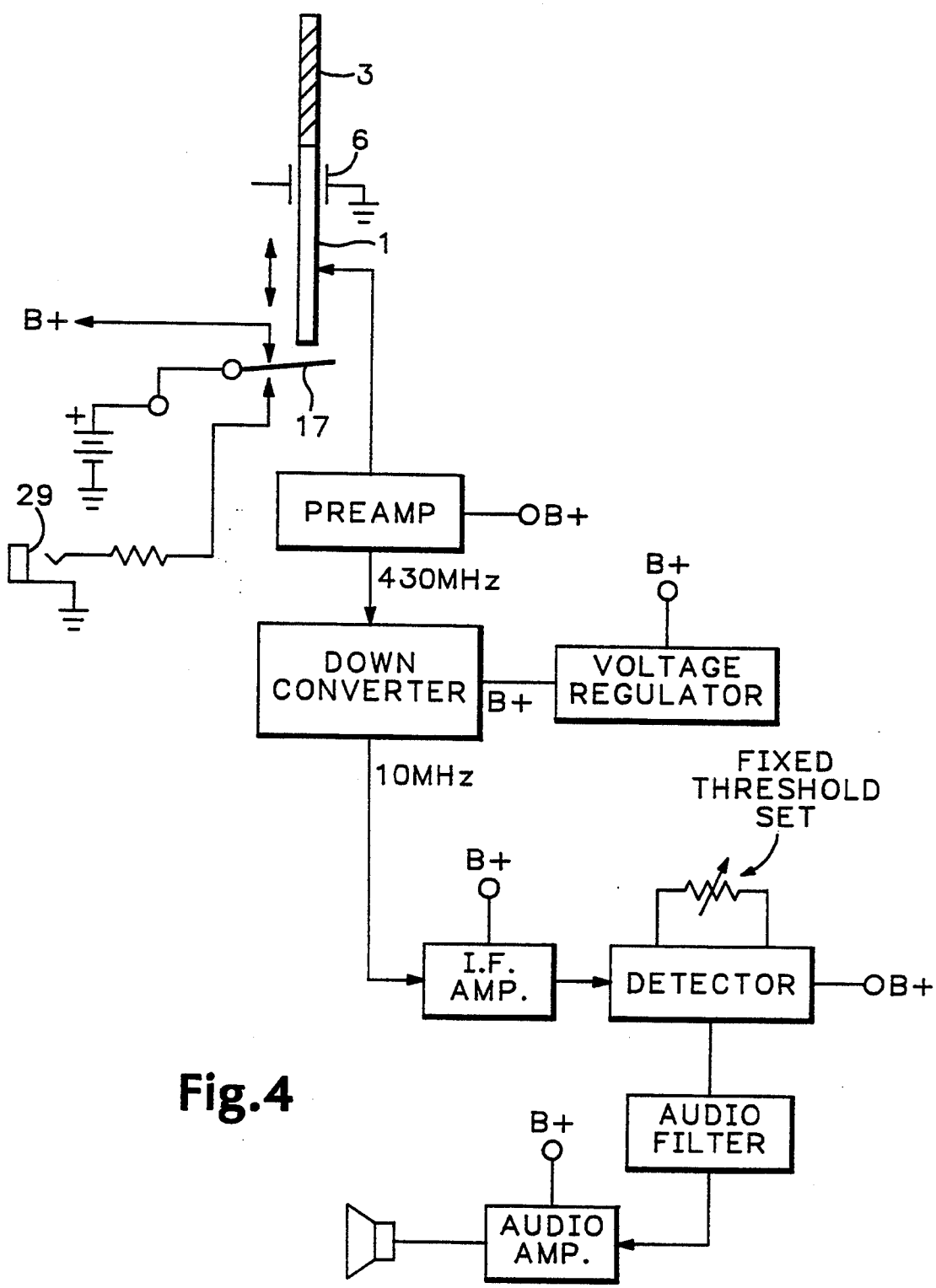
FIG. 4 is a diagram of the electronics required for the locator.

The receiver and other circuitry within housing 10 is shown in FIG. 4. Detailed schematics are not shown since no claim is made on these circuits which are not unique, and could be duplicated by an electronic designer skilled in the art.

It should be noted that a fixed threshold is used, with variable sensitivity provided by the antenna-attenuator assembly 1, 3, 5 and 6.

The Beasley prior art U.S. Pat. No. 3,820,018 uses a variable threshold with fixed sensitivity. For proximity detecting, however, it is found to be more effective to use a fixed threshold.

The single control, which is the goal of the present design, is embodied in the antenna rod/attenuation collar assembly which provides excellent attenuation adjustment, with resultant excellent sensitivity adjustment. Said control also permits turning the battery supply off by pushing in the rod to open the microswitch. Along with use of a UHF frequency and the locating method described, the apparatus is a very effective power line sparking sniffer, or proximity locator.

Said locator is not intended to locate the structure causing a radio or TV interference complaint, but rather to pinpoint on such a structure the source and cause of the complaint. Said structure is found by other means: the RI/TVI investigator may locate the structure with his vehicular equipment, or a line person may suspect a structure as a result of nearby complaints. In either case, a proximity detector is the most effective for pinpointing the source.

The sparking noise search is started with the antenna in full extension and then scanning a suspected area until a noise signal is suddenly heard when the fixed receiver threshold is exceeded by the incoming noise signal. Remaining in that noise area, the operator reduces the sensitivity a step or two with the antenna attenuation rod, and then may notice the reduced area of pickup. Moving towards the source, the operator will periodically reduce the sensitivity until the source is located. It will be apparent to those skilled in the art that various modifications and changes may be made in the size, shape, type, number, frequencies and arrangement of parts described hereinbefore, without departing from the spirit of this invention and the scope of the appended claims.

I claim:

1. Apparatus for detecting electromagnetic radiation emanating from power lines operating at voltages up through extra high voltages, comprising:
   a) a hollow metallic housing,
   b) a hollow metallic attenuation collar grounded to said housing;
   c) an elongated antenna having a metallic portion and a non-conducting portion joined in lengthwise relationship, said antenna extending slidably through and insulated from said attenuation collar with the non-conducting portion projecting outwardly from said attenuation collar, the metallic portion projecting into and insulated from said hollow housing,
   d) receiver means in the housing, the receiver means including an audio amplifier, and
   e) means for connecting said metallic portion of the antenna to said receiver means.

2. The apparatus of claim 1 wherein the receiver means operates at a nominal UHF frequency of 430 MHz.

3. The apparatus of claim 1 wherein the slidable antenna forms a single control for performing all instrument functions.

4. The apparatus of claim 1 including adapter means on the housing for removably attaching the housing to a standard power line hot stick tool holder.

5. The method of detecting sparking electromagnetic radiation emanating from high voltage and extra high voltage transmission lines, comprising probing the RF fields associated with the transmission lines with an attenuating antenna assembly including a metallic attenuating collar grounded to a hollow housing and an elongated antenna extending slidably through and insulated from said attenuating collar and having a metallic portion and a non-conducting portion joined in lengthwise relationship such that the non-conducting portion projects outwardly from the collar and the conductive portion projects inwardly from the collar into and insulated from the housing and is connected to receiving circuitry in the housing including an audio amplifier.

6. The method of claim 5 wherein the probing includes attenuating the RF fields by sliding the attenuating antenna through the metallic attenuation collar.

7. The method of claim 5 wherein the antenna at full extension is placed within the fields associated with high voltage and extra high voltage transmission lines, and moved toward a sparking source while periodically sliding said antenna through the metallic attenuation collar and concomitantly sliding said antenna into said housing.

* * * * *

UNITED STATES PATENT AND TRADEMARK OFFICE
CERTIFICATE OF CORRECTION

PATENT NO. : 5,381,098
DATED : 1/10/95
INVENTOR(S) : MARVIN O. LOFTNESS

It is certified that error appears in the above-identified patent and that said Letters Patent is hereby corrected as shown below:

Column 1, line 10, "high-level" should read --high level--.

Column 1, line 14, "above)" should read --above--.

Column 1, line 18, "power-line" should read --power line--;

line 22, "(Sparking" should read --Sparking--;

line 24, "MHz) should read --MHz.--.

Column 1, line 38, "receiver-said" should read --receiver, said--.

Column 1, line 40, "noise-signal" should read --noise signal--;

Column 1, line 54, "possible-with" should read --possible, with--.

Column 2, line 10, "noise-signal" should read --noise signal--.

UNITED STATES PATENT AND TRADEMARK OFFICE
CERTIFICATE OF CORRECTION

PATENT NO. : 5,381,098
DATED : 1/10/95
INVENTOR(S) : MARVIN O. LOFTNESS

It is certified that error appears in the above-indentified patent and that said Letters Patent is hereby corrected as shown below:

Column 2, line 17, "attenuation-collar" should read
--attenuation collar--.
Column 2, line 22, "attenuation-collar" should read
--attenuation collar--.
Column 3, line 51, "housing" should read --housing,--.
Column 3, line 56, "rod" should read --rod,--.
Column 4, line 3, "housing" should read --housing,--.
Column 4, line 4, "said" should read --, said--.
Column 4, line 32, "this" should read --,--.
Column 4, line 42, "with" should read --, with--.
Column 5, lines 21 and 22 "metal to plastic" should read
--metal-to-plastic--.
Column 5, line 40, "e" should read --8--.
Column 52, "and" should read --, and--.
Column 5, line 57, "noise-source" should read --noise source--.
Column 5, line 64, "pin" should read --pin,--.
Column 68, "noise-signal" should read --noise signal--.
Column 6, line 3, "9, 11, 12, 12 and 21" should read
--9, 11 12, and 21--.
Column 6, line 34, "sparking-noise" should read --sparking noise--.

UNITED STATES PATENT AND TRADEMARK OFFICE
CERTIFICATE OF CORRECTION

PATENT NO. : 5,381,098

DATED : 1/10/95

INVENTOR(S) : MARVIN O. LOFTNESS

It is certified that error appears in the above-indentified patent and that said Letters Patent is hereby corrected as shown below:

Column 7, line 18, "It" should begin a new paragraph.

Signed and Sealed this

Twentieth Day of June, 1995

Attest:

BRUCE LEHMAN

*Attesting Officer*   *Commissioner of Patents and Trademarks*